US011501978B2

(12) United States Patent
Do et al.

(10) Patent No.: US 11,501,978 B2
(45) Date of Patent: Nov. 15, 2022

(54) SEMICONDUCTOR DEVICE AND MANUFACTURING METHOD THEREOF

(71) Applicant: Amkor Technology Singapore Holding Pte. Ltd., Singapore (SG)

(72) Inventors: Won Chul Do, Bucheon-si (KR); Doo Hyun Park, Seongnam-si (KR); Jong Sik Paek, Seongnam-si (KR); Ji Hun Lee, Seoul (KR); Seong Min Seo, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 29 days.

(21) Appl. No.: 17/234,109

(22) Filed: Apr. 19, 2021

(65) Prior Publication Data

US 2021/0265174 A1   Aug. 26, 2021

Related U.S. Application Data

(63) Continuation of application No. 16/418,563, filed on May 21, 2019, now Pat. No. 10,985,031, which is a
(Continued)

(30) Foreign Application Priority Data

Nov. 9, 2012  (KR) ......................... 10-2012-0126932

(51) Int. Cl.
*H01L 21/48*  (2006.01)
*H01L 23/367*  (2006.01)
(Continued)

(52) U.S. Cl.
CPC ........ *H01L 21/4846* (2013.01); *H01L 21/481* (2013.01); *H01L 21/4853* (2013.01);
(Continued)

(58) Field of Classification Search
CPC ............... H01L 21/4846; H01L 21/481; H01L 21/4853; H01L 2924/05042; H01L 2924/05442
See application file for complete search history.

(56) References Cited

U.S. PATENT DOCUMENTS 7,755,176 B1   7/2010  St. Amand
7,902,660 B1   3/2011  Lee et al.
(Continued)

FOREIGN PATENT DOCUMENTS

JP   2004039867   2/2004
JP   2004079658   3/2004
(Continued)

OTHER PUBLICATIONS

PCT, Notification of Transmittal of the International Search Report and the Written Opinion of the International Searching Authority, or the Declaration, in International application No. PCT/US13/69057 dated Apr. 4, 2014. (17 pages).
(Continued)

*Primary Examiner* — Thao P Le
(74) *Attorney, Agent, or Firm* — McAndrews, Held & Malloy, Ltd.

(57) ABSTRACT

Provided are a semiconductor device including an interposer having a relatively thin thickness without a through silicon via and a method of manufacturing the same. The method of manufacturing a semiconductor device includes forming an interposer including a redistribution layer and a dielectric layer on a dummy substrate, connecting a semiconductor die to the redistribution layer facing an upper portion of the interposer, encapsulating the semiconductor die by using an encapsulation, removing the dummy substrate from the interposer, and connecting a bump to the redistribution layer facing a lower portion of the interposer.

20 Claims, 16 Drawing Sheets

Related U.S. Application Data continuation of application No. 15/973,799, filed on May 8, 2018, now Pat. No. 10,297,466, which is a continuation of application No. 15/397,052, filed on Jan. 3, 2017, now Pat. No. 9,966,276, which is a continuation of application No. 14/671,095, filed on Mar. 27, 2015, now Pat. No. 9,536,858, which is a continuation of application No. 13/726,917, filed on Dec. 26, 2012, now Pat. No. 9,000,586.

(51) Int. Cl.
<table>
<tr><td>H01L 23/498</td><td>(2006.01)</td></tr>
<tr><td>H01L 23/538</td><td>(2006.01)</td></tr>
<tr><td>H01L 21/683</td><td>(2006.01)</td></tr>
<tr><td>H01L 23/31</td><td>(2006.01)</td></tr>
<tr><td>H01L 21/56</td><td>(2006.01)</td></tr>
<tr><td>H01L 23/00</td><td>(2006.01)</td></tr>
<tr><td>H01L 23/04</td><td>(2006.01)</td></tr>
<tr><td>H01L 25/065</td><td>(2006.01)</td></tr>
</table>

(52) U.S. Cl.
CPC .......... *H01L 21/56* (2013.01); *H01L 21/561* (2013.01); *H01L 21/563* (2013.01); *H01L 21/568* (2013.01); *H01L 21/6835* (2013.01); *H01L 23/04* (2013.01); *H01L 23/3128* (2013.01); *H01L 23/3135* (2013.01); *H01L 23/3675* (2013.01); *H01L 23/49811* (2013.01); *H01L 23/49816* (2013.01); *H01L 23/49822* (2013.01); *H01L 23/49827* (2013.01); *H01L 23/49838* (2013.01); *H01L 23/5384* (2013.01); *H01L 24/16* (2013.01); *H01L 24/81* (2013.01); *H01L 24/13* (2013.01); *H01L 25/0655* (2013.01); *H01L 2221/68345* (2013.01); *H01L 2221/68381* (2013.01); *H01L 2224/131* (2013.01); *H01L 2224/13082* (2013.01); *H01L 2224/13147* (2013.01); *H01L 2224/16225* (2013.01); *H01L 2224/16227* (2013.01); *H01L 2224/16238* (2013.01); *H01L 2224/32225* (2013.01); *H01L 2224/32245* (2013.01); *H01L 2224/73204* (2013.01); *H01L 2224/73253* (2013.01); *H01L 2224/814* (2013.01); *H01L 2224/81005* (2013.01); *H01L 2224/81191* (2013.01); *H01L 2224/81801* (2013.01); *H01L 2224/83005* (2013.01); *H01L 2224/92125* (2013.01); *H01L 2924/05042* (2013.01); *H01L 2924/05442* (2013.01); *H01L 2924/10253* (2013.01); *H01L 2924/15311* (2013.01); *H01L 2924/16251* (2013.01); *H01L 2924/1816* (2013.01); *H01L 2924/18161* (2013.01); *H01L 2924/19105* (2013.01)

(56) References Cited

U.S. PATENT DOCUMENTS

| | | | |
|---|---|---|---|
| 7,928,001 | B2 | 4/2011 | Kurita |
| 8,106,500 | B2 | 1/2012 | Chow et al. |
| 8,288,201 | B2 | 10/2012 | Pagaila et al. |
| 8,716,853 | B2 | 5/2014 | Do |
| 8,933,473 | B1 | 1/2015 | Dubin |
| 9,000,586 | B2 | 4/2015 | Do et al. |
| 9,536,858 | B2 | 1/2017 | Do et al. |
| 9,966,276 | B2 | 5/2018 | Do et al. |
| 10,283,400 | B1* | 5/2019 | Kelly .................. H01L 23/3142 |
| 10,714,378 | B2* | 7/2020 | Kelly ..................... H01L 25/50 |
| 2007/0029669 | A1 | 2/2007 | Stepniak |
| 2008/0079163 | A1 | 4/2008 | Kurita |
| 2012/0006591 | A1 | 1/2012 | Kaneko et al. |
| 2012/0049344 | A1 | 3/2012 | Pagaila et al. |
| 2012/0094443 | A1 | 4/2012 | Pratt et al. |
| 2014/0124949 | A1* | 5/2014 | Paek ................... H01L 21/6835 |
| | | | 438/126 |
| 2014/0131856 | A1 | 5/2014 | Do et al. |
| 2014/0138817 | A1 | 5/2014 | Paek et al. |
| 2015/0200179 | A1 | 7/2015 | Do et al. |
| 2016/0056079 | A1* | 2/2016 | Kim ..................... H01L 21/561 |
| | | | 438/113 |
| 2017/0117200 | A1* | 4/2017 | Kim ................... H01L 23/5386 |
| 2017/0117249 | A1* | 4/2017 | Ko ...................... H01L 23/5384 |
| 2017/0125264 | A1 | 5/2017 | Do et al. |
| 2017/0148755 | A1 | 5/2017 | Scanlan |
| 2017/0345864 | A1 | 11/2017 | Kinsman |
| 2017/0358560 | A1 | 12/2017 | Kim |
| 2018/0211929 | A1* | 7/2018 | Bae ........................ H01L 24/17 |

FOREIGN PATENT DOCUMENTS

| | | |
|---|---|---|
| JP | 2006024842 | 1/2006 |
| JP | 2007035825 | 2/2007 |

OTHER PUBLICATIONS

Office Action dated Oct. 13, 2015 corresponding to Japanese Patent Application No. JP 2015-541911.

PCT, Notification Concerning Transmittal of International Preliminary Report on Patentability, in application No. PCT/US2013/069057, dated May 21, 2015 (9 pages).

Taiwan Patent Office, Official action in application No. 102140668 (14 [pages).

Chinese Decision of Rejection dated Jul. 27, 2017 for Chinese Patent Application No. 201380069858.7.

Summons to Attend Oral Proceedings Pursuant to Rule 115(1) EPC dated Feb. 5, 2020 for European Patent Application No. 13854060.4.

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a CONTINUATION of U.S. patent application Ser. No. 16/418,563, filed May 21, 2019, and titled "Semiconductor Device and Manufacturing Method Thereof," expected to issue as U.S. Pat. No. 10,985,031; which is a CONTINUATION of U.S. patent application Ser. No. 15/973,799, filed May 8, 2018, titled "Semiconductor Device and Manufacturing Method Thereof," now U.S. Pat. No. 10,297,466; which is a CONTINUATION of U.S. patent application Ser. No. 15/397,052, filed Jan. 3, 2017, titled "Semiconductor Device and Manufacturing Method thereof," now U.S. Pat. No. 9,966,276; which is a CONTINUATION of U.S. patent application Ser. No. 14/671,095, filed Mar. 27, 2015, titled "Semiconductor Device and Manufacturing Method thereof," now U.S. Pat. No. 9,536,858; which is a CONTINUATION of U.S. patent application Ser. No. 13/726,917, filed Dec. 26, 2012, titled "Semiconductor Device and Manufacturing Method thereof," now U.S. Pat. No. 9,000,586; which makes reference to, claims priority to, and claims the benefit of Korean Patent Application No. 10-2012-0126932, filed on Nov. 9, 2012 in the Korean Intellectual Property Office and titled "SEMICONDUCTOR DEVICE AND MANUFACTURING METHOD THEREOF," the contents of each of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, methods and/or architectures for forming electronic packages having interposers are inadequate. Further limitations and disadvantages of conventional and traditional approaches will become apparent to one of skill in the art, through comparison of such approaches with the present invention as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION OF VARIOUS ASPECTS OF THE INVENTION

Figure 1:
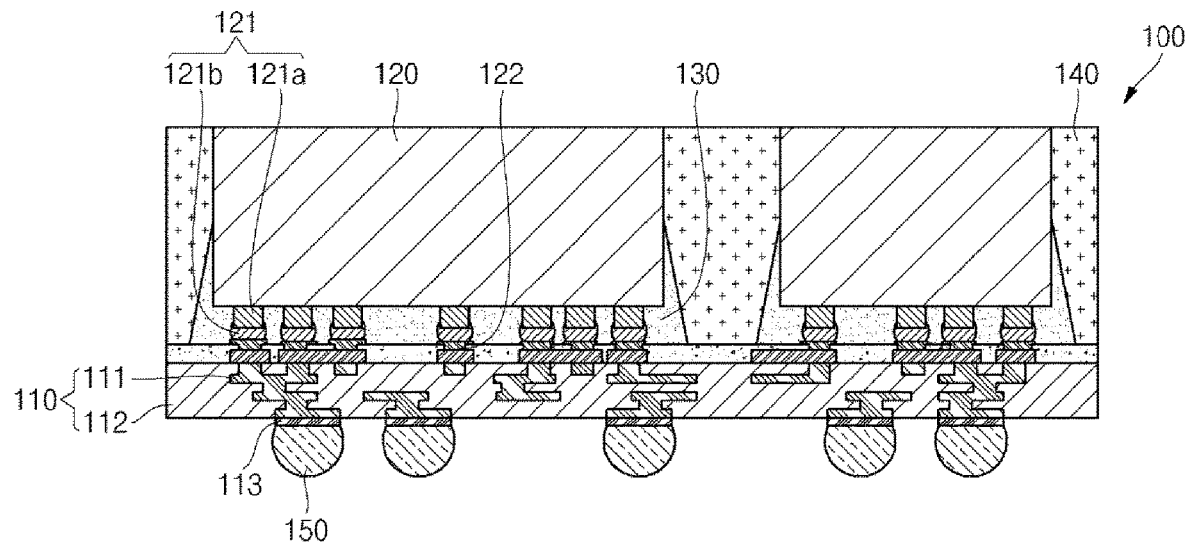
FIG. 1 illustrates a cross-sectional view of a semiconductor device according to an embodiment.

Example embodiments will now be described more fully hereinafter with reference to the accompanying drawings. However, the various aspects of the present invention may be embodied in different forms, and thus the provided exemplary embodiments should not be construed as limiting.

Various embodiments relate to a semiconductor device and a manufacturing method thereof. Generally, after a semiconductor die is mounted on an interposer, one semiconductor device in which the interposer is stacked on the other semiconductor die or substrate is called a 2.5D package. Commonly, 3D packages represent semiconductor devices in which one semiconductor die is stacked on the other semiconductor die or substrate without an interposer.

However, the above-described 2.5D package should have a plurality of through silicon vias so that electrical signals flow between an upper semiconductor die and a lower semiconductor die or substrate. Thus, in the semiconductor device according to the related art, the through silicon vias as well as circuit patterns should be formed in the interposer. As a result, manufacturing costs may be expensive, and also, the semiconductor device may be increased in thickness.

An example aspect of the present invention provides a semiconductor device including an interposer having a relatively thin thickness without a through silicon via and a method of manufacturing the same.

Another example aspect of the present invention provides a semiconductor device in which a redistribution layer having the fine pitch with a submicron unit is capable of being formed since, for example, an interposer is formed on a dummy substrate formed of silicon or glass, and which is capable of being manufactured using various materials and realized in an embedded passive structure and a method of manufacturing the same.

According to at least one of embodiments, a method of manufacturing a semiconductor device includes: forming an interposer including a redistribution layer and a dielectric layer on a dummy substrate; connecting a semiconductor die to the redistribution layer facing an upper portion of the interposer; encapsulating the semiconductor die by using an encapsulation; removing the dummy substrate from the interposer; and connecting a bump to the redistribution layer facing a lower portion of the interposer.

The dummy substrate may, for example, include a silicon or glass. The dielectric layer may, for example, include a silicon oxide layer, a silicon nitride layer, or a polymer layer. A solder may, for example, be formed on the redistribution layer facing the upper portion of the interposer, and the semiconductor die may be connected to the solder.

After the connection of the semiconductor die, an underfill may, for example, be filled between the semiconductor die and the interposer. After the encapsulating of the semiconductor die, the encapsulant may, for example, be ground to expose a top surface of the semiconductor die. The removing of the dummy substrate may, for example, include grinding and etching the dummy substrate to expose the redistribution layer facing the lower portion of the interposer.

The connection of the bump may, for example, include: forming an under bump metal on the redistribution layer facing the lower portion of the interposer; and connecting the bump to the under bump metal. The forming of the interposer may, for example, include previously forming an under bump metal on the redistribution layer facing the lower portion of the interposer.

After the connection of the bump, the bump may, for example, be mounted on a circuit board. An underfill may, for example, be filled between the interposer and the circuit board. A cover may, for example, be attached to the circuit board to cover the semiconductor die.

The forming of the interposer may, for example, include: forming a seed layer on the dummy substrate; forming and patterning the redistribution layer on the seed layer; forming the dielectric layer outside the redistribution layer; grinding and removing the dummy substrate; and removing the seed layer.

The forming of the interposer may, for example, include: forming a seed layer on the dummy substrate; forming an under bump metal on the seed layer; forming and patterning the redistribution layer on the under bump metal; forming the dielectric layer outside the redistribution layer; grinding and removing the dummy substrate; and removing the seed layer. The patterning of the under bump metal may, for example, include removing the seed layer formed outside the under bump metal.

According to another embodiment, a semiconductor device includes: an interposer including a redistribution layer and a dielectric layer; a semiconductor die connected to the redistribution layer facing an upper portion of the interposer; encapsulant encapsulating the semiconductor die; and a bump connected to the redistribution layer facing a lower portion of the interposer.

The dielectric layer may, for example, include a silicon oxide layer, a silicon nitride layer, or a polymer layer. A solder may, for example, be formed on the redistribution layer facing the upper portion of the interposer, and the semiconductor die may be connected to the solder. An underfill may, for example, be filled between the semiconductor die and the interposer. A top surface of the semiconductor die may, for example, be exposed through the encapsulant.

An under bump metal may, for example, be disposed between the redistribution layer facing the lower portion of the interposer and the bump. The under bump metal may, for example, be disposed inside the interposer. The bump may, for example, be mounted on a circuit board. An underfill may, for example, be filled between the interposer and the circuit board. A cover may, for example, be attached to the circuit board to cover the semiconductor die.

Various example embodiments will now be described more fully hereinafter with reference to the accompanying drawings.

Embodiments may be embodied in different forms and should not be construed as limited to the embodiments set forth herein. Rather, these embodiments are provided so that this disclosure will be thorough and complete, and will fully convey the scope of the disclosure to those skilled in the art.

In the drawing figures, the dimensions of layers and regions may be exaggerated for clarity of illustration. As used herein, the term and/or includes any and all combinations of one or more of the associated listed items.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Also, though terms like a first and a second are used to describe various members, components, regions, layers, and/or portions in various embodiments of the present invention, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment.

Also, the terms "semiconductor die" used in this specification may, for example, include a semiconductor chip having an active circuit or a passive circuit, a semiconductor wafer, or its equivalent. Also, in this specification, a dummy substrate may, for example, include silicon, glass, or its equivalent. Also, in this specification, a dielectric layer may, for example, include silicon, glass, or its equivalent.

FIG. 1 illustrates a cross-sectional view of a semiconductor device according to an embodiment.

Referring to FIG. 1, a semiconductor device 100 according to an embodiment includes an interposer 110, a semiconductor die 120, an underfill 130, an encapsulant 140, and a bump 150.

The interposer 110 includes a redistribution layer 111 and a dielectric layer 112. For example, the interposer 110 may include a redistribution layer 111 having a multi-layered structure, and the redistribution layer 111 may be protected by the dielectric layer 112. The redistribution layer 111 disposed on each of bottom and top surfaces is directly exposed through the dielectric layer 112. Also, the redistribution layer 111 disposed on each of the bottom and top surface of the dielectric layer 112 may, for example, have a relatively large width so that the bump is easily formed later. As described above, the portion of the redistribution layer 111 having the relatively large width may, for example, be defined as a pad or land.

Here, the redistribution layer 111 may, for example, be formed of one selected from copper, aluminum, and their equivalents. Also, the dielectric layer 112 may, for example, be formed of one selected from a silicon oxide layer, a silicon nitride layer, a polymer layer, and their equivalents. However, the present disclosure is not limited to these materials. As an example, when the silicon oxide layer or the silicon nitride layer is used as the dielectric layer 112, the redistribution layer 111 may, for example, have a fine pitch with a submicron unit. In some cases, a passive device may be embedded. This may, for example, be done because the redistribution layer 111 and the dielectric layer 112 may be patterned by using a line width embodied in a semiconductor fabrication (FAB) process when the dielectric layer 112 includes the silicon oxide layer or the silicon nitride layer. As previously known, the line width embodied in a package process may be significantly greater than that embodiment in the semiconductor FAB process. Furthermore, since the interposer 110 might not need through silicon vias, unlike a related art, the interposer 110 may have a thin thickness and be manufactured with low costs.

The semiconductor die 120 may, for example, include a common memory, a graphics processing unit (GPU), a central processing unit (CPU), or its equivalent. However, the present disclosure is not limited to these kinds. The semiconductor die 120 includes a connection terminal 121 electrically connectable to the interposer 110. As illustrated, the connection terminal 121 may, for example, include a copper pillar 121a and a solder cap 121b disposed on an end of the copper pillar 121a. The connection terminal 121 may, for example, include a common solder bump. Also, a solder 122 may be previously disposed between the connection terminal 121 and the interposer 110, i.e., on a top surface of the redistribution layer 111 facing an upper portion of the interposer 110 to easily connect the interposer 110 to the connection terminal 121. As a result, the semiconductor die 120 may be electrically connected to the redistribution layer 111 facing the upper portion of the interposer 110.

The underfill 130 is filled between the interposer 110 and the semiconductor die 120. More particularly, the underfill 130 may be disposed between the interposer 110 and the semiconductor die 120 and also surround a side surface of a lower portion of the semiconductor die 120. The underfill 130 may, for example, improve physical/mechanical coupling between the interposer 110 and the semiconductor die 120. In addition, the underfill 130 may prevent the interposer 110 and the semiconductor die 120 from being separated from each other by a stress due to, for example, a difference in the respective coefficients of thermal expansion between the interposer 110 and the semiconductor die 120.

The encapsulant 140 surrounds the semiconductor die 120 disposed above the interposer 110 to protect the semiconductor die against external environments. More particularly, the encapsulant 140 surrounds surfaces of the semiconductor die 120 and the underfill 130. However, a top surface of the semiconductor die 120 may be exposed to the outside from the encapsulant 140 to improve heat dissipation performance of the semiconductor die 120.

Here, a side surface of the encapsulant 140 may be flush with a side surface of the interposer 110. Also, a top surface of the encapsulant 140 may be flush with the top surface of the semiconductor die 120. As a result, the semiconductor device 100 according to the current embodiment may have a compact structure.

The bump 150 is connected to the redistribution layer 111 facing a lower portion of the interposer 110. More particularly, a bump metal 113 is disposed on the redistribution layer 111 exposed through a bottom surface of the interposer 110, and then the bump 150 is connected to the bump metal 113. The bump 150 may, for example, have a relatively small size when compared to that of a common solder ball. Thus, the bump 150 may be defined as a micro bump. For example, the bump 150 may have a diameter of about 100 μm or less. However, a solder ball that will be described below may have a diameter of about 200 μm to about 400 μm.

Therefore, the semiconductor device 100 according to the current embodiment may be, for example, manufactured in a flip chip shape. Thus, the semiconductor device 100 having the flip chip shape may, for example, be mounted on a circuit board for common semiconductor device or semiconductor package. Alternatively, the semiconductor device 100 according to the current embodiment may be mounted on a mother board or a main board.

Therefore, the current embodiment may, for example, provide the semiconductor device 100 (flip chip device) having the interposer 110 having a relatively thin thickness without through silicon vias. Also, since, for example, the current embodiment uses the silicon oxide layer or the silicon nitride layer, which are formed of a nonorganic material, the redistribution layer 111 having the fine pitch with the submicron unit may be provided. Also, the current embodiment may, for example, provide the semiconductor device 100 including the interposer 110 which may be realized in an embedded passive structure.

Figure 2:
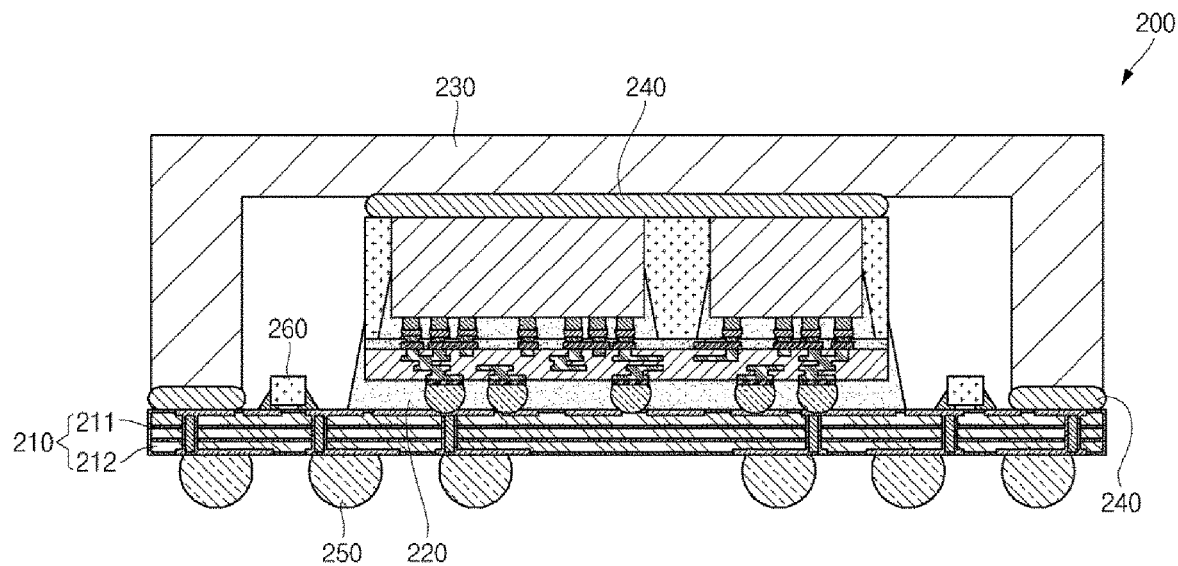
FIG. 2 illustrates a cross-sectional view of a semiconductor device according to another embodiment.

FIG. 2 illustrates a cross-sectional view of a semiconductor device according to another embodiment.

Referring to FIG. 2, a semiconductor device 200 according to another embodiment includes the above-described device 100 (hereinafter, referred to as a flip chip device), a circuit board 210, an underfill 220, a cover 230, a thermal conductive adhesive 240, and a solder ball 250.

As described above, the flip chip device 100 has the bottom surface on which the bump 150 is disposed. The bump 150 is mounted on the circuit board 210.

The circuit board 210 includes a circuit pattern 211 and an insulation layer 212. Furthermore, a passive device 260 may, for example, be mounted on the circuit board 210. Also, as described above, the bump 150 of the flip chip device 100 is electrically connected to the circuit pattern 211 of the circuit board 210.

The underfill 220 is filled between the interposer 100 and the circuit board 210. That is, the underfill 220 surrounds the bump 150 as well as side surfaces of the interposer 110 of the flip chip device 100 and the encapsulant 140. Thus, it may prevent the flip chip device 100 and the circuit board 210 from being separated from each other by a stress due to a difference in respective coefficients of thermal expansion between the flip chip device 100 and the circuit board 210.

The cover 230 may be attached to the circuit board 210 and also approximately surround the flip chip device 100. Thus, the flip chip device 100 may be protected against external environments by the cover 230. The cover may, for example, be formed of a metal, ceramic, or its equivalent to improve heat dissipation performance, but the present disclosure is not limited thereto.

The thermal conductive adhesive 240 is disposed between the flip chip device 100 and the cover 230 and between the cover 230 and the circuit board 210. The thermal conductive adhesive 240 may quickly transfer heat generated from the flip chip device 100 into the cover 230. Also, the thermal conductive adhesive 240 may fix the cover 230 to the flip chip device 100 and the circuit board 210.

The solder ball 250 is connected to a bottom surface of the circuit board 210. That is, the solder ball 250 is electrically connected to the circuit pattern 211 of the circuit board 210. Due to the solder ball 250, the semiconductor device 200 according to the current embodiment may, for example, be mounted on a mother board or main board of electronic equipment such as a computer, a smart phone, and the like.

Therefore, the current embodiment may, for example, provide a 2.5D semiconductor device including the semiconductor device 100 (flip chip device) having the interposer 110 having a relatively thin thickness without through silicon vias. Also, since, for example, the current embodiment uses a silicon oxide layer or a silicon nitride layer which are formed of a nonorganic material, a redistribution layer 111 having a fine pitch with a submicron unit may be provided. Also, the current embodiment may provide the semiconductor device 200 including the semiconductor device 100 including the interposer 110 which may be realized in an embedded passive structure.

FIGS. 3A to 3F illustrate cross-sectional views sequentially showing a method of manufacturing a semiconductor device according to another embodiment.

Referring to FIGS. 3A to 3F, a method of manufacturing a semiconductor device 100 according to an embodiment includes forming an interposer 110 on a dummy substrate 310, connecting a semiconductor die 120 to the interposer 110, encapsulating the semiconductor die 120 by using an encapsulant 140, grinding the encapsulant 140, grinding the dummy substrate 310, and connecting a bump 150. This will now be described in detail.

Figure 3A:
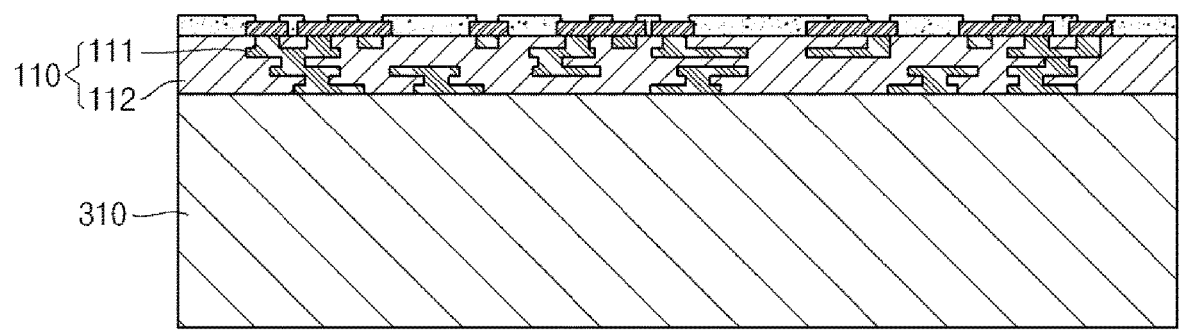
FIGS. 3A to 3F illustrate cross-sectional views sequentially showing a method of manufacturing a semiconductor device according to another embodiment.
Figure 3B:
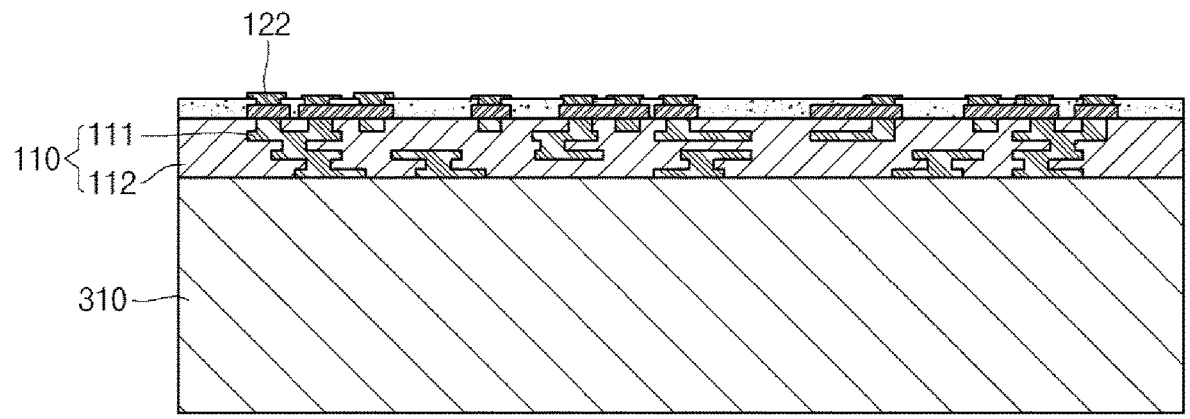

As shown in FIGS. 3A and 3B, in the forming of the interposer 110 on the dummy substrate 310, the interposer 110 is directly formed on the dummy substrate 310. That is, the interposer 110 including a redistribution layer 111 and a dielectric layer 112 is directly formed on the dummy substrate 310. As described above, the redistribution layer 111 may, for example, have a multi-layered structure. The redistribution layer 111 (which may be defined as a pad or land) having a relatively large width may be formed on each of top and bottom surfaces of the dielectric layer 112. Here, the redistribution layer 111 may, for example, be formed of one selected from copper, aluminum, and their equivalents. Also, the dielectric layer 112 may, for example, be formed of one selected from a silicon oxide layer, a silicon nitride layer, a polymer layer, and their equivalents. However, the present disclosure is not limited to these materials. Furthermore, a solder 122 may, for example, be previously formed on the redistribution layer 111 (a pad or land) formed on a top surface of the dielectric layer 112 to easily electrically connect the semiconductor die 120 thereto later. Here, the dummy substrate 310 may, for example, be formed of one of silicon, glass, and their equivalents. However, the present disclosure is not limited to a kind of dummy substrate 310. As described above, since, for example, a silicon oxide layer or a silicon nitride layer that is formed of a nonorganic material is used as the dummy substrate 310, the redistribution layer 111 having a fine pitch and fine width may be formed.

Figure 3C:
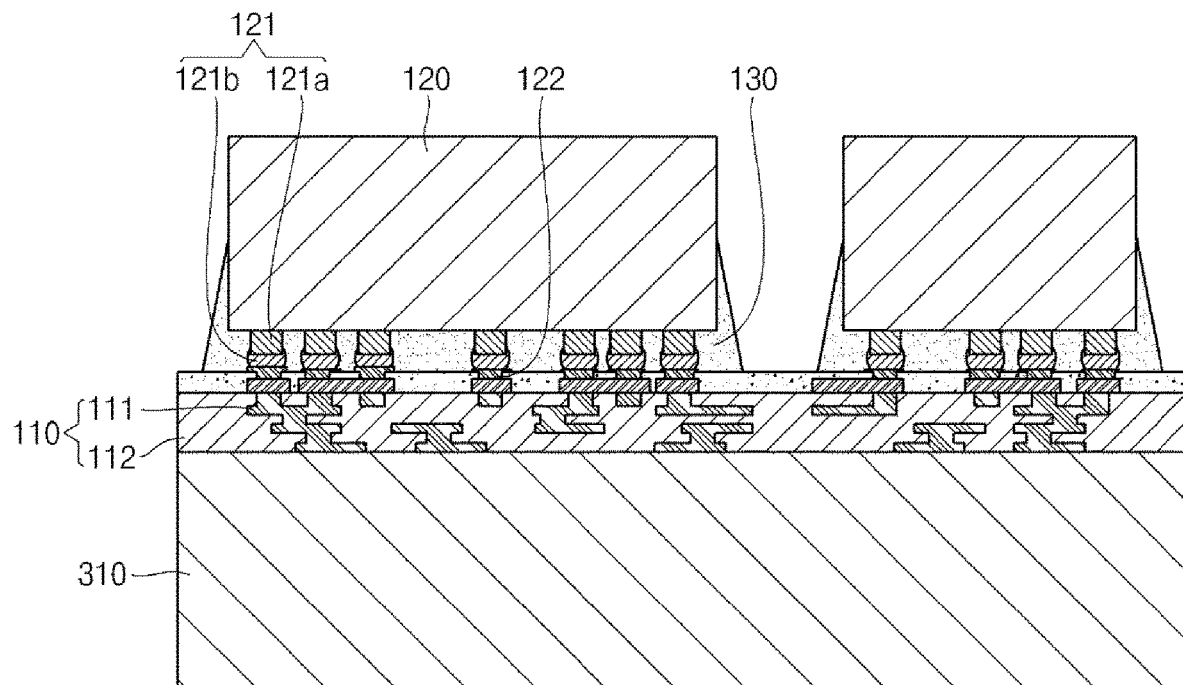

As shown in FIG. 3C, in the connecting of the semiconductor die 120 to the interposer 110, the semiconductor die 120 is electrically connected to the interposer 110. That is, a connection terminal 121 (a copper pillar 121a and a solder cap 121b) of the semiconductor die 120 is electrically connected to the solder 122 which is previously formed on the interposer 110. Furthermore, an underfill 130 is filled between the interposer 110 and the semiconductor die 120. The underfill 130 covers a lower region of a side surface of the semiconductor die 120.

Figure 3D:
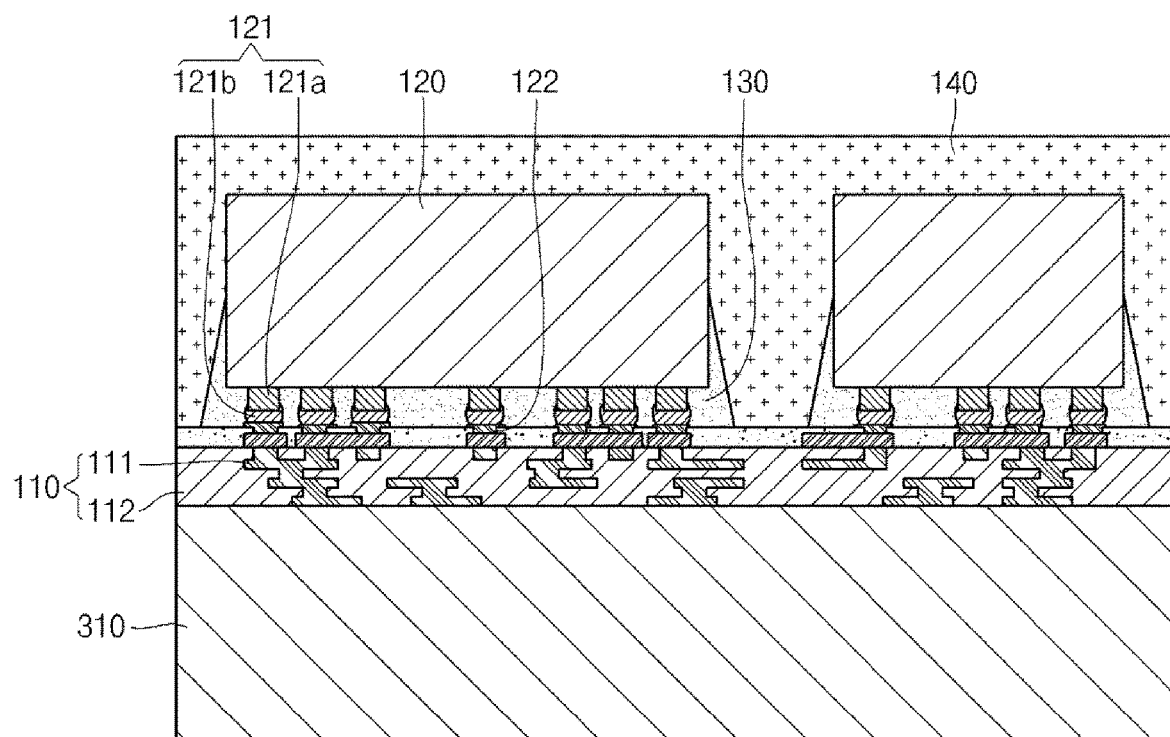

As shown in FIG. 3D, in the encapsulating of the semiconductor die 120 by using the encapsulant 140, the semiconductor die 120 is encapsulated on the interposer 110 by using the encapsulant 140. That is, surfaces of the underfill 130 and the semiconductor die 120 which are formed on the interposer 110 may be surrounded by the encapsulant 140.

Figure 3E:
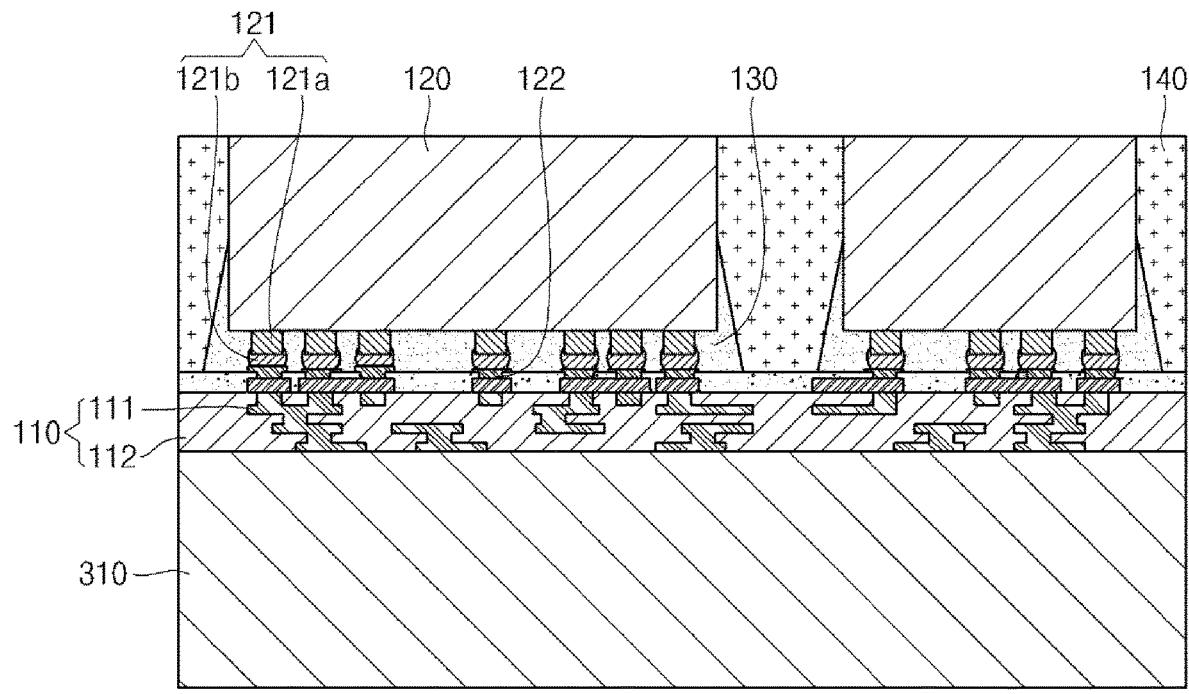

As shown in FIG. 3E, in the grinding of the encapsulant 140, the encapsulant 140 formed on the semiconductor die 120 is ground and removed by a predetermined thickness. For example, the encapsulant 140 may be ground and removed until a top surface of the semiconductor die 120 is exposed to the outside.

Figure 3F:
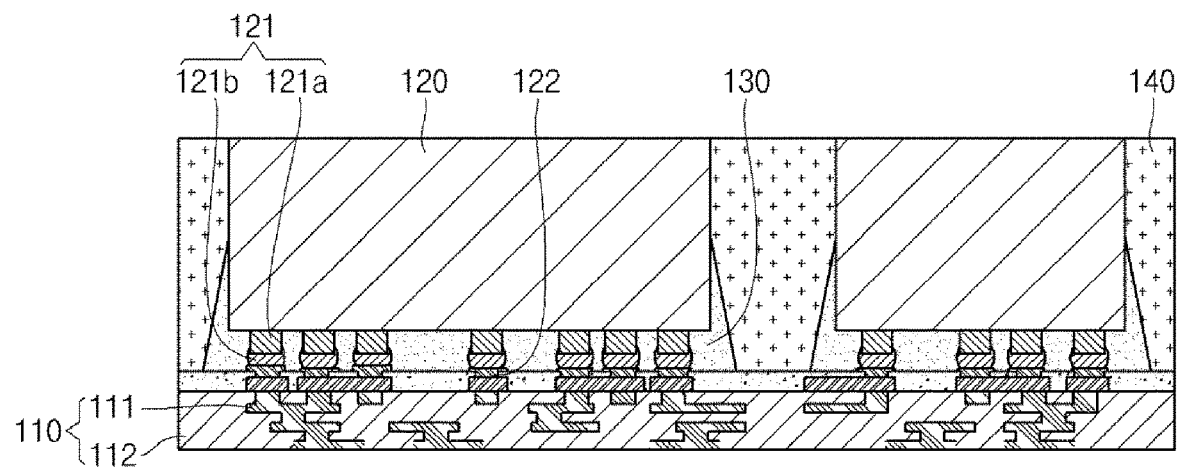

As shown in FIG. 3F, in the grinding of the dummy substrate 310, the dummy substrate 310 disposed under the interposer 110 is ground and/or etched, and thus removed. Thus, the redistribution layer 111 (the pad or land) is exposed to the outside through a lower portion of the interposer 110.

Although not shown, an under bump metal 113 may be formed on the redistribution layer 111 exposed through the lower portion of the interposer 110 as described above, and the bump 150 may be connected to the under bump metal 113. (see FIG. 1)

Furthermore, in the formed semiconductor device 100, i.e., the flip chip device 100, the bump 150 may be mounted on the circuit board 210. Also, an underfill 220 may, for example, be formed between the flip chip device 100 and the circuit board 210. Furthermore, a cover 230 may, for example, be attached to the flip chip device 100 and the circuit board 210 through a thermal conductive adhesive 240. Also, the solder ball 250 may be connected to a bottom surface of the circuit board 210, which may, for example, form the 2.5D package device 200. (see FIG. 2)

Therefore, the current embodiment may, for example, provide the method of manufacturing the semiconductor device 100 having the interposer 110 having a relatively thin thickness without through silicon vias and the semiconductor device 200 including the semiconductor device 100. Also, since, for example, the interposer 110 is formed on the dummy substrate 310 formed of silicon or glass, the redistribution layer 111 having a fine pitch with a submicron unit may be formed. In addition, the current embodiment may provide the method of manufacturing the semiconductor device 100 including the interposer 110 which may, for example, be formed using various materials and realized in an embedded passive structure and the semiconductor device 200 including the semiconductor device 100.

FIGS. 4A to 4D illustrate cross-sectional views of a method of manufacturing a front part of an interposer 110 in a method of manufacturing a semiconductor device 100 according to another embodiment. FIGS. 5A to 5E illustrate cross-sectional views of a method of manufacturing a rear part of the interposer 110 in the method of manufacturing the semiconductor device 100 according to another embodiment.

As shown in FIGS. 4A to 4D and 5A to 5E, the method of forming the interposer 110 includes forming a seed layer 311 on a dummy substrate 310, patterning a redistribution layer 111, etching the seed layer 311, forming a dielectric layer 112, removing the dummy substrate 310, and removing the seed layer 311. This will now be described in detail.

Figure 4A:
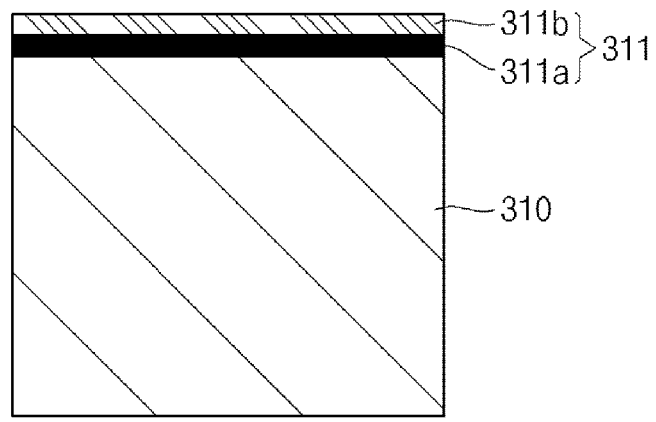
FIGS. 4A to 4D illustrate cross-sectional views of a method of manufacturing a front part of an interposer in a method of manufacturing a semiconductor device according to another embodiment.

As shown in FIG. 4A, in the forming of the seed layer 311 on the dummy substrate 310, a titanium layer 311a/copper layer 311b or a titanium/tungsten layer 311a/copper layer 311b may, for example, be formed on an entire top surface of the dummy substrate 310 to provide the seed layer 311 that will be used for plating the redistribution layer 111 later.

Figure 4B:
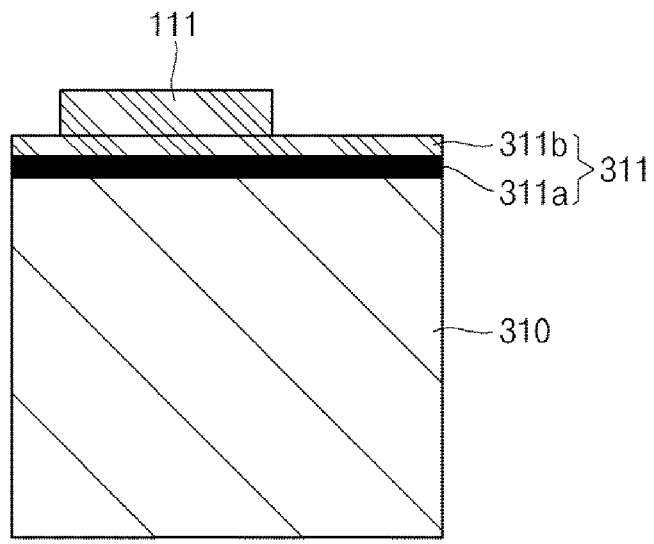

As shown in FIG. 4B, in the patterning of the redistribution layer 111, the redistribution layer 111 is patterned and formed on the seed layer 311. That is, after a copper layer or an aluminum layer is plated on an entire top surface of the seed layer 311, a photolithography process is performed to form the redistribution layer 111 having a predetermined pattern. Here, the seed layer 311 formed outside the redistribution layer 111 is not removed yet.

Figure 4C:
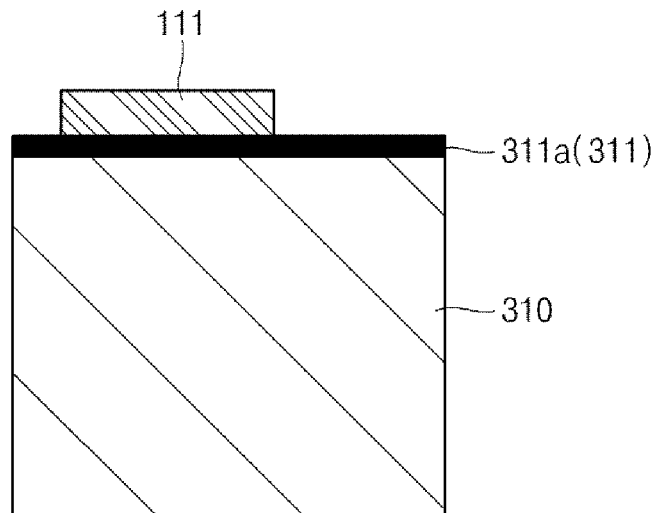

As shown in FIG. 4C, in the etching of the seed layer 311, for example, the copper layer 311b of the seed layer 311 formed outside the redistribution layer 111 is etched and removed. That is, the titanium layer or the titanium/tungsten layer 311a remains still.

Figure 4D:
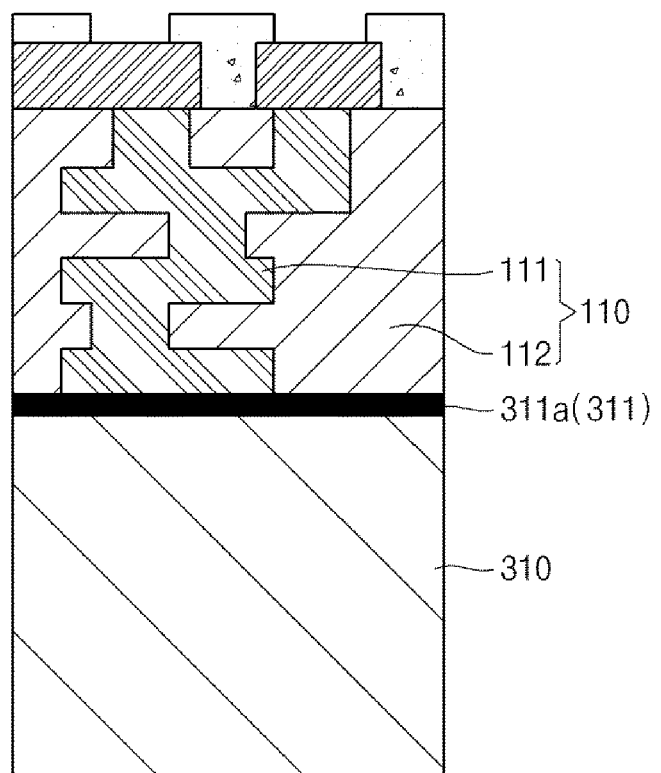

As shown in FIG. 4D, in the forming of the dielectric layer 112, the dielectric layer 112 is formed around the redistribution layer 111. Furthermore, the forming of the redistribution layer 111 and the dielectric layer 112 may be performed several times. That is, the redistribution layer 111 and the dielectric layer 112 may build up on the dummy substrate 310 several times. On the other hand, since, for example, the redistribution layer 111 and the dielectric layer 112 alternately build up, the required redistribution layer 111 may be formed. Thus, the interposer 110 may have a small size and thin thickness. In addition, a passive structure may be embedded in the interposer 110.

Here, the redistribution layer 111 formed on each of the uppermost and lowermost portions of the dielectric layer 112 may, for example, have a relatively wide width (pad or land).

Figure 5A:
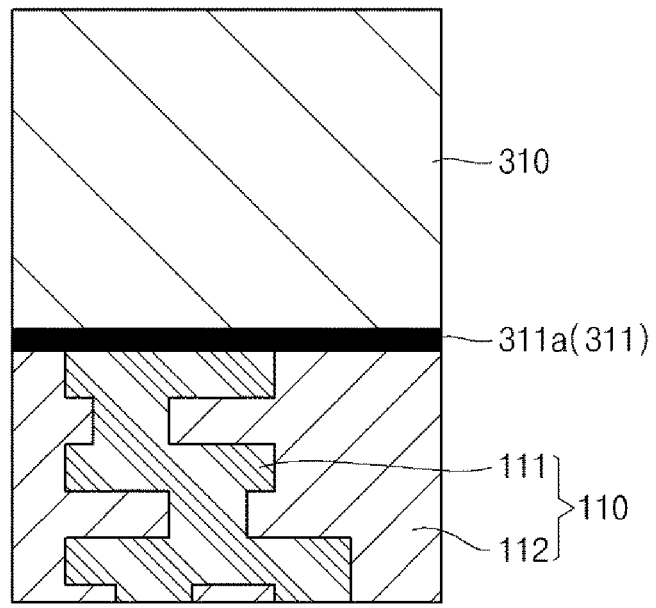
FIGS. 5A to 5E illustrate cross-sectional views of a method of manufacturing a rear part of the interposer in the method of manufacturing the semiconductor device according to another embodiment.
Figure 5B:
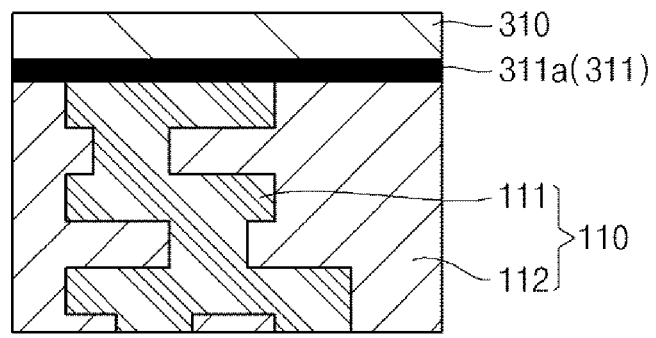
Figure 5C:
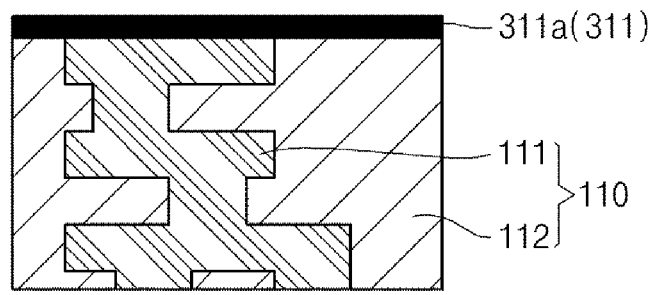

As shown in FIGS. 5A to 5C, in the removing of the dummy substrate 310, the dummy substrate 310 on which the interposer 110 is mounted is removed. That is, as shown in FIGS. 5A and 5B, a portion of the dummy substrate 310 having a relatively thick thickness is removed by the grinding process, and then, a remaining portion having a relatively thin thickness is removed by the etching process. As a result, as shown in FIG. 5C, the titanium layer or the titanium/tungsten layer 311a of the seed layer 311 is exposed to the outside.

Figure 5D:
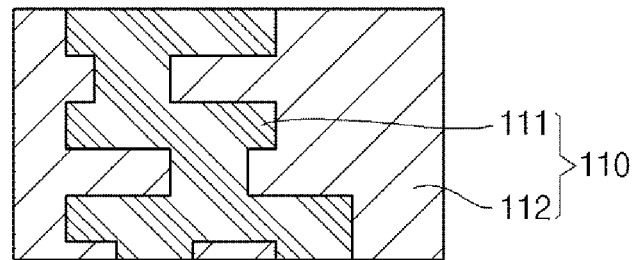

As shown in FIG. 5D, in the removing of the seed layer 311, the seed layer 311 remaining on the interposer 110, i.e., the titanium layer or the titanium/tungsten layer 311a is removed. Thus, the redistribution layer 111 having a relatively wide width in the interposer 110 is exposed to the outside through the dielectric layer 112.

Figure 5E:
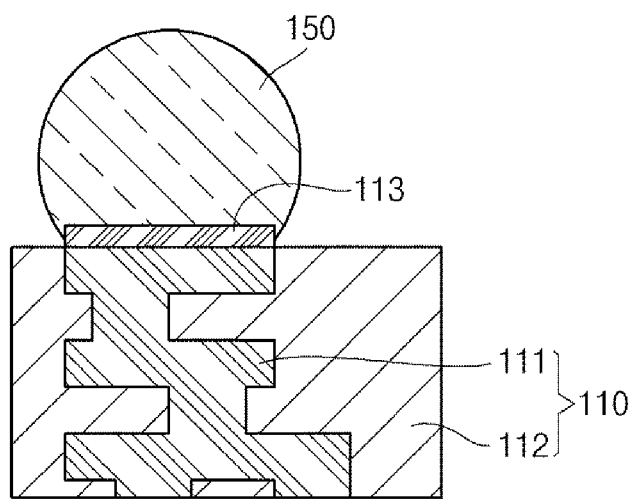

Furthermore, as shown in FIG. 5E, after the seed layer 311 is removed, an under bump metal 113 may be formed on the redistribution layer 111 exposed through the dielectric layer 112, and then, a bump 150 may be connected to the under bump metal 113. Thus, the under bump metal 113 protrudes from the dielectric layer 112, and the bump 150 approximately surrounds the under bump metal 113.

FIGS. 6A to 6D illustrate cross-sectional views of a method of manufacturing a front part of an interposer 110 in a method of manufacturing a semiconductor device 100 according to another embodiment. FIGS. 7A to 7E illustrate cross-sectional views of a method of manufacturing a rear part of the interposer 110 in the method of manufacturing the semiconductor device 100 according to another embodiment.

As shown in FIGS. 6A to 6D and 7A to 7E, the method of forming the interposer 110 includes forming a seed layer 311 on a dummy substrate 310, forming an under bump metal 113 on the seed layer 311, etching the seed layer 311, forming a redistribution layer 111, forming a dielectric layer 112, removing the dummy substrate 310, and removing the seed layer 311. This will now be described in detail.

Figure 6A:
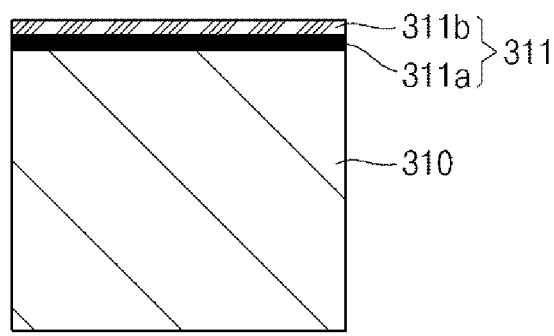
FIGS. 6A to 6D illustrate cross-sectional views of a method of manufacturing a front part of an interposer in a method of manufacturing a semiconductor device according to another embodiment.

As shown in FIG. 6A, in the forming of the seed layer 311 on the dummy substrate 310, a titanium layer 311a/copper layer 311b or a titanium-tungsten layer 311a/copper layer 311b may, for example, be formed on an entire top surface of the dummy substrate 310 to provide the seed layer 311.

Figure 6B:
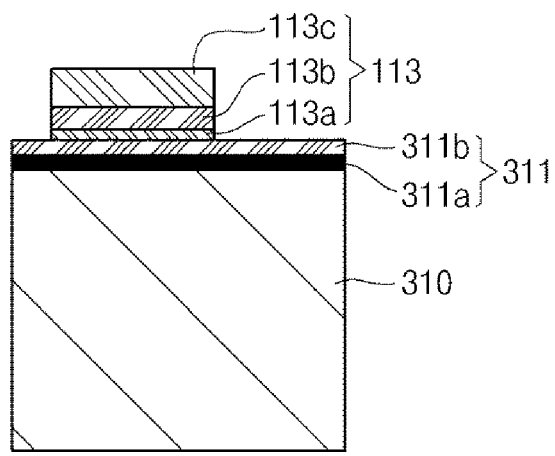

As shown in FIG. 6B, in the forming of the under bump metal 113 on the seed layer 311, for example, a gold layer 113a, a nickel layer 113b, and a copper layer or an aluminum layer 113c are sequentially formed on the seed layer 311 to form the under bump metal 113.

Figure 6C:
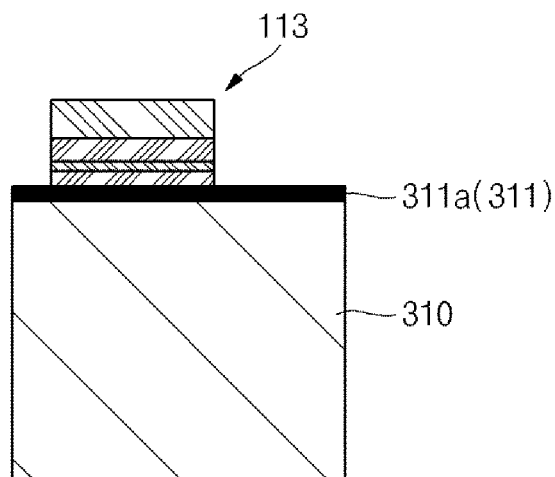

As shown in FIG. 6C, in the etching of the seed layer 311, for example, the copper layer of the seed layer 311 remaining outside the under bump metal 113 is etched and removed. That is, the titanium layer or the titanium-tungsten layer 311a remains still.

Figure 6D:
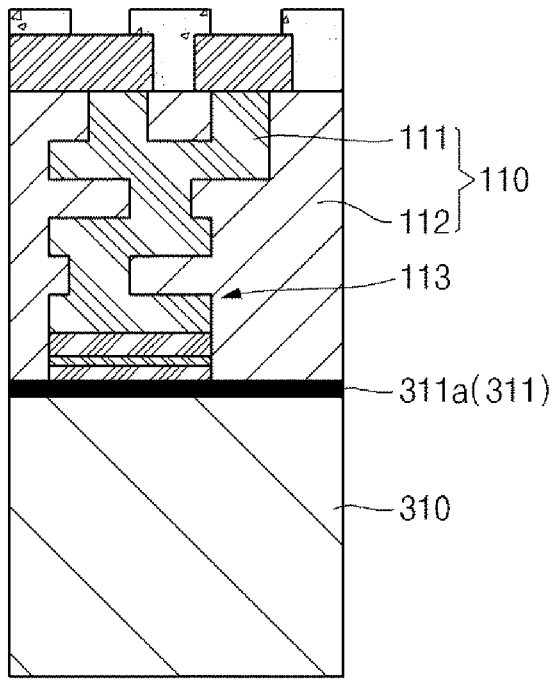

As shown in FIG. 6D, in the forming of the redistribution layer 111 and the forming of the dielectric layer 112, the redistribution layer 111 is patterned on the under bump metal 113, and also the dielectric layer 112 is formed therearound. That is, after a copper layer or an aluminum layer is plated on the under bump metal 113, a photolithography process is performed to form the redistribution layer 111 having a predetermined pattern. Also, the dielectric layer 112 is formed around the redistribution layer 111. Furthermore, the forming of the redistribution layer 111 and the dielectric layer 112 may be performed several times. That is, the above-described build up process may be performed.

Here, the redistribution layer 111 formed on the uppermost surface of the interposer 110 and having a relatively wide width may, for example, be defined as a pad or land.

Figure 7A:
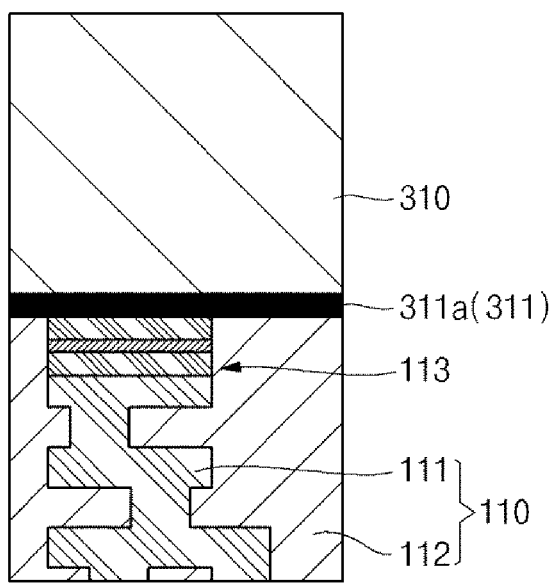
FIGS. 7A to 7E illustrate cross-sectional views of a method of manufacturing a rear part of the interposer in the method of manufacturing the semiconductor device according to another embodiment.
Figure 7B:
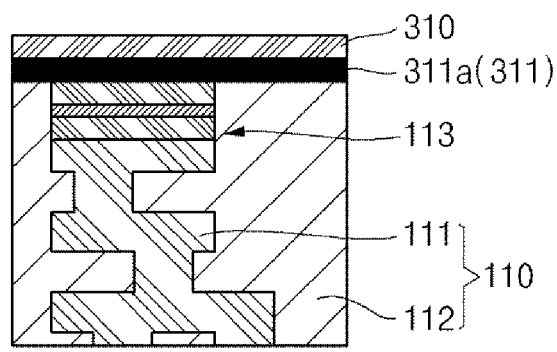
Figure 7C:
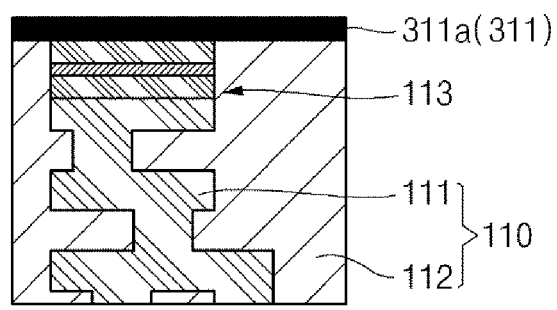

As shown in FIGS. 7A to 7C, in the removing of the dummy substrate 310, the dummy substrate 310 on which the interposer 110 is mounted is removed. That is, as shown in FIGS. 7A and 7B, a portion of the dummy substrate 310 having a relatively thick thickness is removed by the grinding process, and then, a remaining portion having a relatively thin thickness is removed by the etching process. As a result, as shown in FIG. 7C, the titanium layer or the titanium/tungsten layer 311a of the seed layer 311 is exposed to the outside.

Figure 7D:
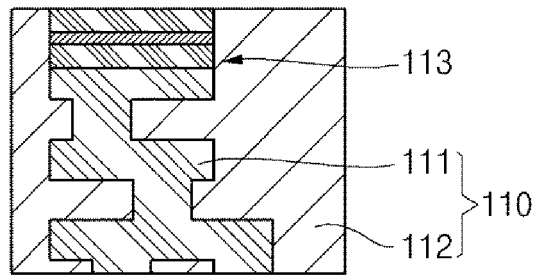

As shown in FIG. 7D, in the removing of the seed layer 311, the seed layer 311 remaining on the interposer 110, i.e., the titanium layer or the titanium/tungsten layer 311a is removed. Thus, the under bump metal 113 is exposed to the outside through the dielectric layer 112. That is, bottom and side surfaces of the under bump metal 113 are disposed within the dielectric layer 112. Also, only a top surface of the under bump metal 113 is exposed to the outside through the dielectric layer 112. That is to say, the exposed surface of the under bump metal 113 is flush with the exposed surface of the dielectric layer 112.

Figure 7E:
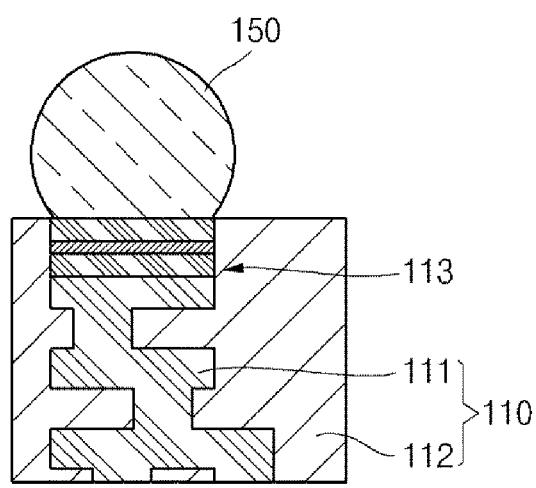

Furthermore, as shown in FIG. 7E, after the seed layer 311 is removed, a bump 150 is connected to the under bump metal 113 exposed through the dielectric layer 112. That is, since, for example, the under bump metal 113 is previously formed in the forming of the interposer 110, it may be unnecessary to form the under bump metal 113 through a separate process for connecting the bump 150 later. Alternatively, due to these process characteristics, the under bump metal 113 is not disposed inside the bump 150.

FIGS. 8A to 8D illustrate cross-sectional views of a method of manufacturing a front part of an interposer 110 in a method of manufacturing a semiconductor device 100 according to another embodiment. FIGS. 9A to 9E illustrate cross-sectional views of a method of manufacturing a rear part of the interposer 110 in the method of manufacturing the semiconductor device 100 according to another embodiment.

Figure 8A:
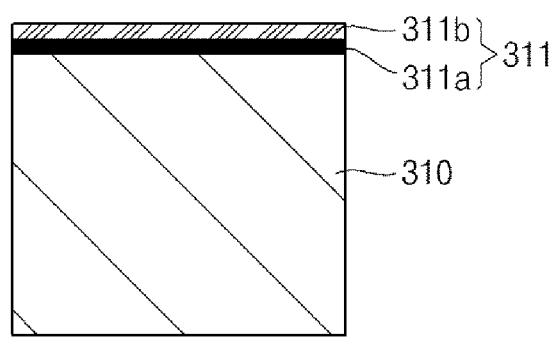
FIGS. 8A to 8D illustrate cross-sectional views of a method of manufacturing a front part of an interposer in a method of manufacturing a semiconductor device according to another embodiment.
Figure 8B:
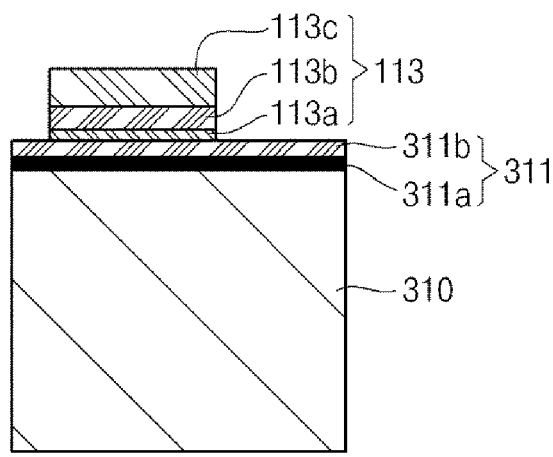
Figure 8C:
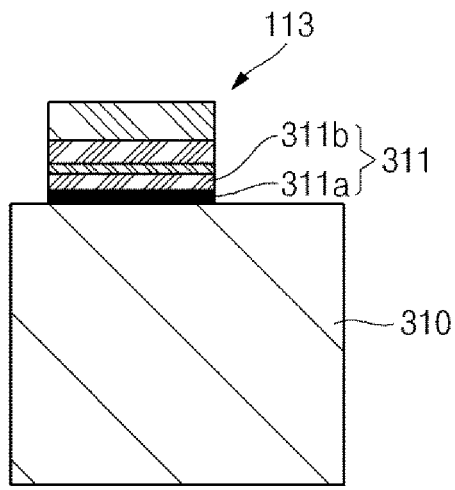
Figure 8D:
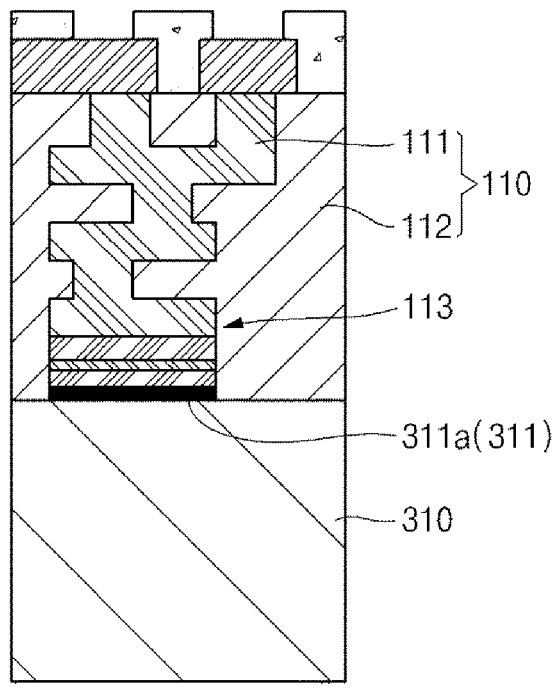
Figure 9A:
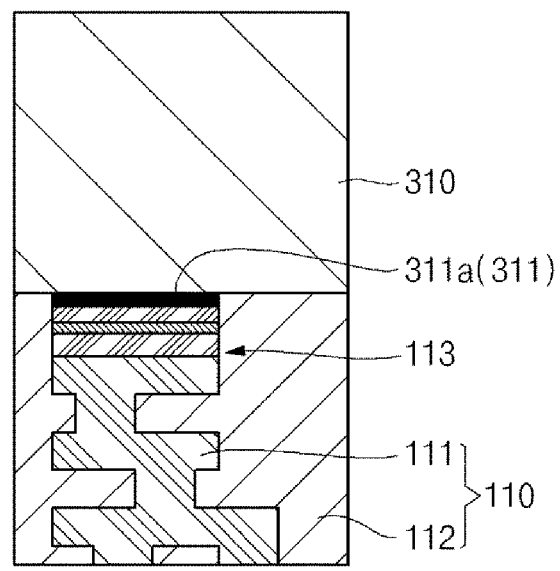
FIGS. 9A to 9E illustrate cross-sectional views of a method of manufacturing a rear part of the interposer in the method of manufacturing the semiconductor device according to another embodiment.
Figure 9B:
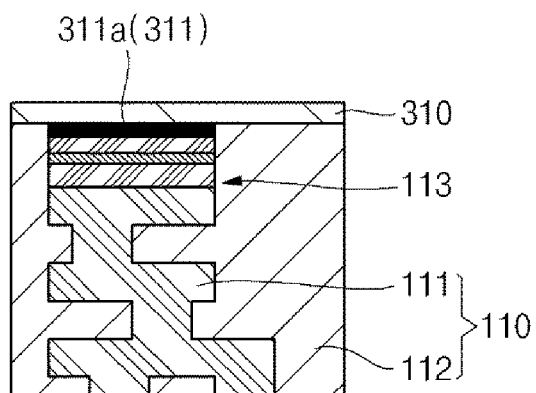
Figure 9C:
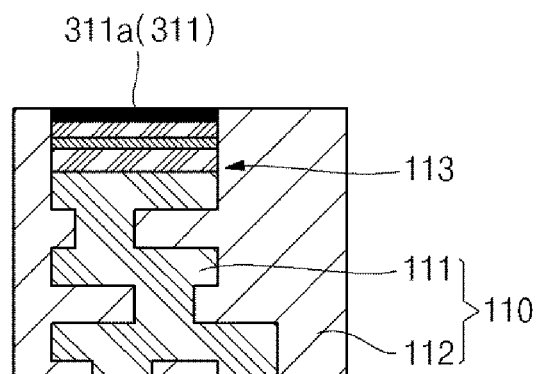
Figure 9D:
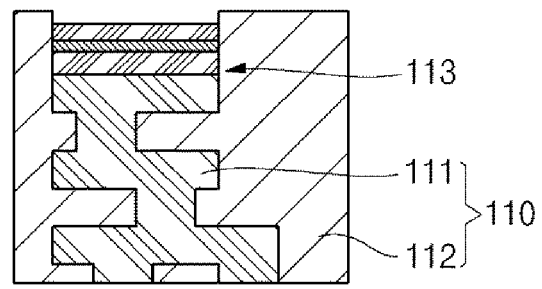
Figure 9E:
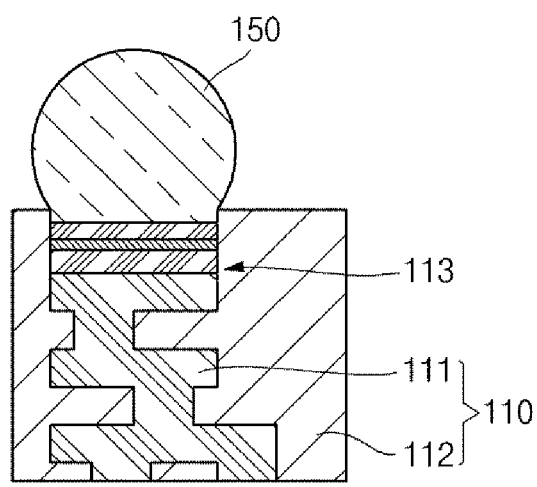

As shown in FIGS. 8A to 8D and 9A to 9E, the method of manufacturing the interposer 110 according to the current embodiment is similar to that according to the foregoing embodiments. However, as shown in FIG. 8C, the method of manufacturing the interposer 110 according to the current embodiment is different from that according to the foregoing embodiments in that a seed layer 311 formed outside an under bump metal 113 is completely removed in etching of the seed layer 311. That is, as shown in FIG. 8C, the seed layer 311 does not remain outside the under bump metal 113. Also, as shown in FIGS. 9C and 9D, it may be that the seed layer 311 formed on the under bump metal 113 is removed before a solder is connected to a bump. Thus, an exposed surface of the under bump metal 113 is not flush with an exposed surface of a dielectric layer 112. That is, the exposed surface of the under bump metal 113 is disposed at a position lower than that of the exposed surface of the dielectric layer 112. Thus, a side portion of the bump 150 contacts the dielectric layer 112.

Embodiments provide the semiconductor device including the interposer having a relatively thin thickness without through silicon vias and the method of manufacturing the same.

Also, since, for example, the interposer is formed on the dummy substrate formed of silicon or glass, for example, the redistribution layer having the fine pitch with a submicron unit may be formed. In addition, the embodiments may provide the method of manufacturing the semiconductor device including the interposer which may be formed using various materials and realized in the embedded passive structure and the semiconductor device including the same.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

What is claimed is:

1. A method of manufacturing a semiconductor device, the method comprising:
   receiving a first structure comprising:
      a temporary support material; and
      an interposer comprising:
         an interposer conductive material; and
         an interposer dielectric material;
   coupling a semiconductor die to a first side of the interposer utilizing a first plurality of conductive bumps, where each conductive bump of the first plurality of conductive bumps is connected to a respective part of the interposer conductive material;
   removing the temporary support material from the first structure to reveal a second side of the interposer; and
   coupling a second plurality of conductive bumps to the second side of the interposer.

2. The method of claim 1, wherein said removing the temporary support material comprises grinding and/or etching the temporary support material.

3. The method of claim 1, wherein the first structure comprises a silicon material and a polymer material.

4. The method of claim 1, wherein the temporary support material comprises silicon.

5. The method of claim 1, wherein said coupling the second plurality of conductive bumps to the second side of the interposer comprises coupling each conductive bump of the second plurality of conductive bumps to a respective part of an under bump metallization.

6. The method of claim 5, comprising forming the under bump metallization prior to said coupling the semiconductor die.

7. The method of claim 5, wherein the under bump metallization is part of the received first structure.

8. A method of manufacturing a semiconductor device, the method comprising:
   receiving a first structure comprising:
      an interposer comprising:
         an interposer conductive material;
         an interposer dielectric material; and
         an under bump metallization (UBM);
   coupling a semiconductor die to a first side of the interposer utilizing a first plurality of conductive bumps, where each conductive bump of the first plurality of conductive bumps is connected to a respective part of the interposer conductive material; and
   coupling a second plurality of conductive bumps to a second side of the interposer, where said coupling the second plurality of conductive bumps comprises coupling each conductive bump of the second plurality of conductive bumps to a respective part of the under bump metallization.

9. The method of claim 8, wherein the interposer dielectric material laterally surrounds an entirety of at least one layer of the under bump metallization (UBM).

10. The method of claim 8, wherein the under bump metallization (UBM) comprises a first UBM layer and a second UBM layer, and the interposer dielectric material surrounds an entirety of the first and second UBM layers.

11. The method of claim 8, wherein the first structure comprises silicon.

12. The method of claim 8, wherein the first structure comprises a glass, and further comprising removing the glass.

13. The method of claim 8, wherein said coupling the semiconductor die is performed prior to said coupling the second plurality of conductive bumps.

14. The method of claim 8, wherein the interposer dielectric material laterally surrounds an entirety of at least one layer of the under bump metallization (UBM).

15. The method of claim 8, comprising encapsulating the semiconductor die in an encapsulating material such that the encapsulating material laterally surrounds an entirety of the semiconductor die, and a back side of the semiconductor die is exposed from the encapsulating material.

16. A semiconductor device comprising:
   a package substrate comprising a top substrate side and a bottom substrate side;
   a first signal distribution structure (SDS1) comprising a top SDS1 side, and a bottom SDS1 side directly coupled to the top substrate side, where:
      the first signal distribution structure (SDS1) is a multi-layer signal distribution structure;
      the first signal distribution structure (SDS1) is laterally narrower than the package substrate; and
      the first signal distribution structure (SDS1) is an only multi-layer signal distribution structure directly coupled to the top substrate side;
   a first semiconductor die coupled to the top SDS1 side; and
   a second semiconductor die coupled to the top SDS1 side.

17. The semiconductor device of claim 16, comprising a second signal distribution structure (SDS2) comprising a top SDS2 side and a bottom SDS2 side, where:
- the second signal distribution structure (SDS2) is a multi-layer signal distribution structure;
- the first semiconductor die is directly coupled to the top SDS2 side;
- the second semiconductor die is directly coupled to the top SDS2 side;
- the bottom SDS2 side is coupled to the top SDS1 side; and
- the second signal distribution structure (SDS2) is an only multi-layer signal distribution structure directly coupled to the top SDS1 side.

18. The semiconductor device of claim 17, wherein:
- the first semiconductor die comprises a die solder that is soldered to the top SDS2 side; and
- the second signal distribution structure (SDS2) comprises an SDS2 solder,
- where the first semiconductor die is electrically coupled to the first signal distribution structure (SDS1) through the die solder and the SDS2 solder.

19. The semiconductor device of claim 17, comprising a protective member attached to the top substrate side, where the protective member laterally surrounds the first semiconductor die, the second semiconductor die, the first signal distribution structure (SDS1), and the second signal distribution structure (SDS2).

20. The semiconductor device of claim 17, wherein:
- a first one of SDS1 and SDS2 comprises an organic material;
- a second one of SDS1 and SDS2 comprises an inorganic material; and
- the package substrate comprises a circuit board.

* * * * *